United States Patent [19]
Pine et al.

[11] Patent Number: 5,288,986
[45] Date of Patent: Feb. 22, 1994

[54] BINARY CODE MATRIX HAVING DATA AND PARITY BITS

[75] Inventors: Jerrold S. Pine, Boca Raton; Gary K. Blitman; Brian L. Grinage, both of Boynton Beach; German Gonzalez, Miami, all of Fla.

[73] Assignee: Motorola, Inc., Schaumburg, Ill.

[21] Appl. No.: 946,209

[22] Filed: Sep. 17, 1992

[51] Int. Cl.⁵ .................... G06K 19/06; G06K 7/10
[52] U.S. Cl. ..................... 235/494; 235/465; 235/487; 235/460; 235/456; 382/56
[58] Field of Search ............ 235/494, 487, 493, 435, 235/454, 456, 460, 463, 465, 485; 382/56

[56] References Cited

U.S. PATENT DOCUMENTS

| | | | |
|---|---|---|---|
| 3,763,467 | 10/1973 | Cash et al. | 235/456 |
| 4,263,504 | 4/1981 | Thomas | 235/454 |
| 4,736,109 | 4/1988 | Dvorzsak | 235/464 |
| 4,924,078 | 5/1990 | Sant Anselmo et al. | 235/494 |
| 4,939,354 | 7/1990 | Priddy et al. | 235/456 |
| 4,998,010 | 3/1991 | Chandler et al. | 235/464 |
| 5,128,528 | 7/1992 | Heninger | 235/494 |
| 5,204,515 | 4/1993 | Yoshida | 235/494 |

OTHER PUBLICATIONS

Technical Paper entitled "Unique Symbol for Marking and Tracking Very Small Semiconductor Products" by James P. Martin, published Sep. 1991, by Veritec, Inc. of Chatsworth, Ca.

Primary Examiner—Donald Hajec
Assistant Examiner—Esther Chin
Attorney, Agent, or Firm—Philip P. Macnak; Thomas G. Berry; Daniel R. Collopy

[57] ABSTRACT

An optically readable matrix (100) has four intersecting sides of approximately equal length defining a perimeter and includes a binary code formed from light and dark squares of substantially equal sizes located within the perimeter. The matrix (100) comprises first and second orientation squares (105, 110) included in the light and dark squares and located in opposite corners of the matrix (100). Each of the orientation squares (105, 110) preferably includes a contrasting circular area (115, 120) located in a predetermined position within the orientation square (105, 110) and having a predetermined size relationship with the orientation square (105, 110). Such a matrix (100) may be formed on a printed circuit board (505) for use in an electronic device (500) to convey information about the printed circuit board (505). An apparatus (600) for decoding the matrix (100) includes an optical scanner (610) for scanning the matrix (100) and for locating the orientation squares (105, 110). Determination circuitry (710) coupled to the scanner (610) determines the size and distance between the circular areas (115, 120) relays the information to computing circuitry (715), which computes the size, orientation, and density of the matrix (100). A controller (705) thereafter translates the binary code.

17 Claims, 3 Drawing Sheets

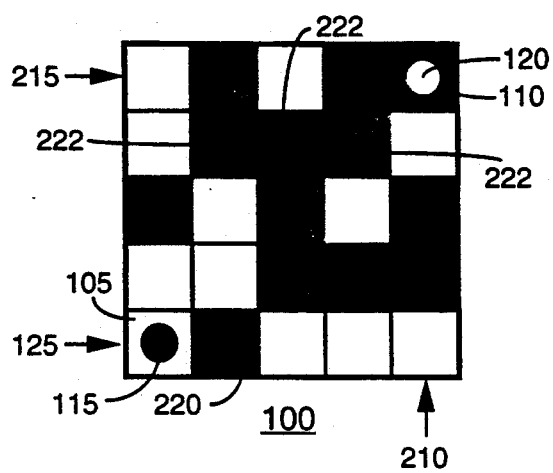
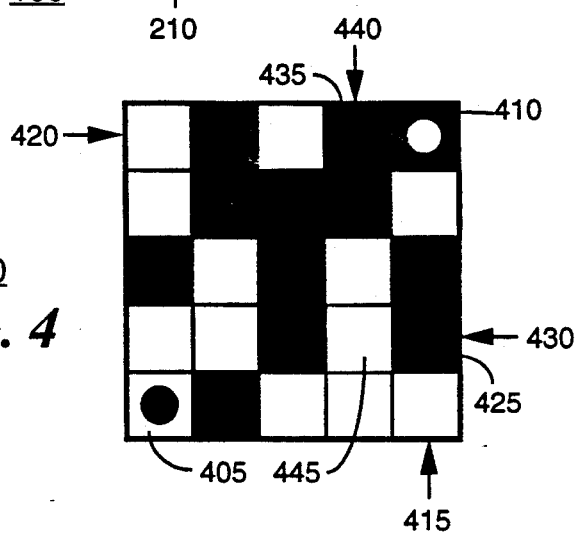
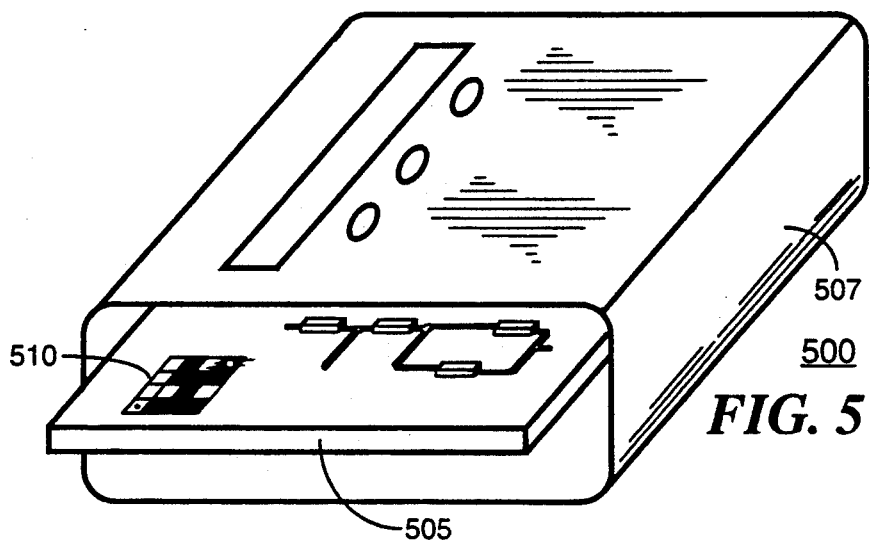

| DECIMAL | BINARY | CHARACTER | DECIMAL | BINARY | CHARACTER |
|---|---|---|---|---|---|
| 0 | 000000 | SPACE | 32 | 100000 | @ |
| 1 | 000001 | ! | 33 | 100001 | A |
| 2 | 000010 | " | 34 | 100010 | B |
| 3 | 000011 | # | 35 | 100011 | C |
| 4 | 000100 | $ | 36 | 100100 | D |
| 5 | 000101 | % | 37 | 100101 | E |
| 6 | 000110 | & | 38 | 100110 | F |
| 7 | 000111 | ' | 39 | 100111 | G |
| 8 | 001000 | ( | 40 | 101000 | H |
| 9 | 001001 | ) | 41 | 101001 | I |
| 10 | 001010 | * | 42 | 101010 | J |
| 11 | 001011 | + | 43 | 101011 | K |
| 12 | 001100 | , | 44 | 101100 | L |
| 13 | 001101 | - | 45 | 101101 | M |
| 14 | 001110 | . | 46 | 101110 | N |
| 15 | 001111 | / | 47 | 101111 | O |
| 16 | 010000 | 0 | 48 | 110000 | P |
| 17 | 010001 | 1 | 49 | 110001 | Q |
| 18 | 010010 | 2 | 50 | 110010 | R |
| 19 | 010011 | 3 | 51 | 110011 | S |
| 20 | 010100 | 4 | 52 | 110100 | T |
| 21 | 010101 | 5 | 53 | 110101 | U |
| 22 | 010110 | 6 | 54 | 110110 | V |
| 23 | 010111 | 7 | 55 | 110111 | W |
| 24 | 011000 | 8 | 56 | 111000 | X |
| 25 | 011001 | 9 | 57 | 111001 | Y |
| 26 | 011010 | : | 58 | 111010 | Z |
| 27 | 011011 | ; | 59 | 111011 | [ |
| 28 | 011100 | < | 60 | 111100 | \ |
| 29 | 011101 | = | 61 | 111101 | ] |
| 30 | 011110 | > | 62 | 111110 | ^ |
| 31 | 011111 | ? | 63 | 111111 | NULL |

*FIG. 3*

BINARY CODE MATRIX HAVING DATA AND PARITY BITS

FIELD OF THE INVENTION

This invention relates in general to optically readable codes, and more specifically to an optically readable binary code matrix having data and parity bits.

BACKGROUND OF THE INVENTION

In many conventional applications, optically readable codes are imprinted on components to convey information to optical sensors or other such scanning devices. Bar codes, such as the universal product code (UPC), are one type of optically readable code that is often printed on consumer articles for scanning past an optical sensor. The optical sensor typically decodes information from the code imprinted on a consumer article, subsequent to which the decoded information may be routed to further processing equipment. A bar code printed on an item in a grocery store, for instance, may be scanned past an optical sensor to decode price information included in the bar code. Thereafter, the price information is automatically transmitted to a cash register, which typically prints the price information on a customer receipt, thereby saving time by eliminating the need for manual price entry on the cash register keyboard. Bar codes, however, are usually rather large and, as a result, may be unsuitable for use with smaller products, such as miniature paging receivers, that have a minimum of available space. Additionally, because information in bar codes is represented by uniform bars of various widths, bar codes are often difficult to print on non-paper surfaces, such as metals or plastics, that have rough or uneven surfaces. Therefore, bar codes printed on such surfaces may be illegible to optical scanning devices, possibly resulting in the erroneous decoding of information.

Another example of coded information is an optically readable matrix, formed as a "checker board" symbol that represents information in the form of black and white squares. Typically, the information is coded in a binary code, wherein 0's are represented by squares of one color and 1's are represented by squares of another color. The binary code matrix possesses several advantages over the conventional bar code. For example, the binary code matrix may be more easily decoded when printed on a rough or uneven surface since irregularities do not affect the interpretation of the information as long as the color of the square can be determined. Additionally, the size of the binary code matrix may be adjusted, by decreasing or increasing the size of the squares, depending on the space available in which to print the matrix.

Conventionally, however, a portion of the available space for the binary code matrix is utilized to distinguish the binary code matrix from the surrounding area. For example, one typical binary code matrix employs a "quiet zone", i.e., an area around the perimeter of the binary code matrix in which no further information can be located. An optical scanning device searches for this quiet zone to locate the binary code matrix. Another type of binary code matrix is recognized by an optical scanning device when two or more rows of solid black squares along the perimeter of the binary code matrix are located. As a result, a relatively large amount of space, which otherwise might be used to convey additional information, is wasted in differentiating the binary code matrix from the surrounding area.

Although the conventional binary code matrix is inherently more accurate than the bar code, errors may nevertheless occur in decoding the included information. Such errors most commonly occur when a square is mistaken for the opposite color or is incorrectly colored and, as a result, the information is decoded erroneously. As a safeguard against decoding errors, some typical binary code matrices include identical information in two or more different locations within the binary code matrix. In this case, however, the optical scanning device which decodes the information has no method of detecting which is the correct information if the information in one location differs from the information in the other location. Furthermore, the duplication of information contained in the binary code matrix may almost double the size of the matrix, thereby wasting space which is often already at a premium.

Thus, what is needed s an optically readable binary code matrix that maximizes space usage. The binary code matrix should also utilize a minimal number of squares to distinguish the binary code matrix from the surrounding area. Furthermore, the binary code matrix should include data by which errors in decoded information may be detected and corrected.

SUMMARY OF THE INVENTION

An optically readable matrix having four intersecting sides of approximately equal length defining a perimeter, the matrix including a binary code formed from light and dark areas of substantially equal sizes located within the perimeter, comprises a first light area, two sides of which are bounded by first and second sides of the four intersecting sides, the first light area containing a first geometrically shaped area, wherein the first geometrically shaped area is dark, and wherein the first geometrically shaped area is located in a predetermined position within the first light area and has a predetermined size relationship with the first light area. The matrix further comprises a first dark area, two sides of which are bounded by third and fourth sides of the four intersecting sides, the first dark area containing a second geometrically shaped area, wherein the second geometrically shaped area is light, and wherein the second geometrically shaped area is located in a predetermined position within the first dark area and has a predetermined size relationship with the first dark area.

BRIEF DESCRIPTION OF THE DRAWINGS

FIG. 1 depicts a binary code matrix in accordance with a preferred embodiment of the present invention.

FIG. 2 is an illustration of types of information included within the binary code matrix of FIG. 1 in accordance with the preferred embodiment of the present invention.

FIG. 3 is a chart by which binary numbers represented by black and white squares included in the binary code matrix of FIG. 1 may be translated in accordance with the preferred embodiment of the present invention.

FIG. 4 is an illustration of a binary code matrix containing parity information by which erroneously coded information, also contained in the binary code matrix, may be detected and corrected in accordance with the preferred embodiment of the present invention.

FIG. 5 is an illustration of an electronic device having a printed circuit board on which is imprinted a binary code matrix in accordance with the preferred embodiment of the present invention.

DESCRIPTION OF A PREFERRED EMBODIMENT

Figure 6:
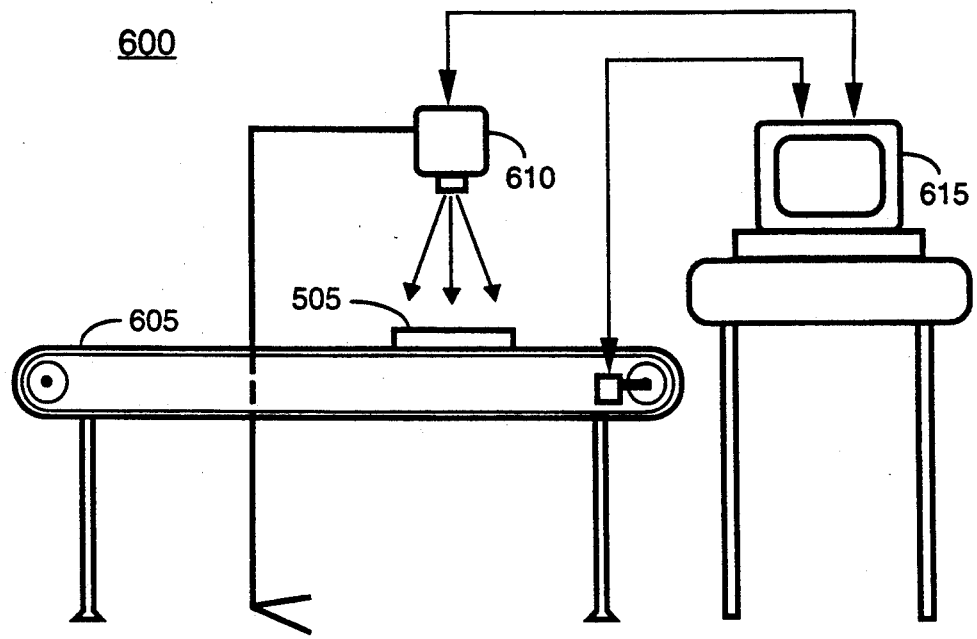
FIG. 6 depicts the utilization of optical scanning equipment to decode, in accordance with the preferred embodiment of the present invention, information included in the binary code matrix of FIG. 5.

FIG. 1 is an illustration of a binary code matrix 100 in accordance with a preferred embodiment of the present invention. The matrix 100 includes four intersecting sides of equal length which define a matrix perimeter. Information included in the matrix 100 is preferably represented by a plurality of black and white squares of equal sizes enclosed by the matrix perimeter, although it may be appreciated that other contrasting colors, rather than black and white, may be utilized to form the plurality of squares.

According to the present invention, the matrix perimeter further encloses two orientation squares 105, 110 located in opposite corners of the matrix 100. More specifically, the orientation squares 105, 110 may be located, as shown, in the lower left corner of the matrix 100 and the upper right corner of the matrix 100. The first orientation square 105, white in color, is bounded by first and second sides of the four intersecting sides. A black circle 115, the diameter of which is half the length of the first orientation square 105, is located in the center of the first orientation square 105. The diameter of the black circle 115, therefore, determines the length and width of each of the black and white squares, which, as mentioned above, are equal in size. The second orientation square 110, black in color, is bounded by third and fourth sides of the four intersecting sides, and a white circle 120, preferably having a diameter equal to that of the black circle 115, is centered therein. The orientation squares 105, 110 are recognized by optical scanning equipment as indicating the presence of the matrix 100. Additionally, in accordance with the preferred embodiment of the present invention, the orientation squares 105, 110 indicate the size and density of the matrix 100.

The size of the matrix 100 is defined to be the length of each of the four intersecting sides, which is given by the formula $$l = \frac{d_1}{\sqrt{2}} + 2d_2,$$

wherein l represents the length of each of the four intersecting sides, $d_1$ represents the distance between the center of the black circle 115 and the center of the white circle 120, and $d_2$ represents the diameter of the circles 115, 120. The density of the matrix 100 is the total number of black and white squares, including the orientation squares 105, 110, located within the perimeter of the matrix 100. Because the diameter of the circles 115, 120 is half the length of the orientation squares 105, 110, the number of black and white squares bounded by a single side of the four intersecting sides, represented by the symbol n, is given by the formula $$n = \frac{1}{2d_2}.$$

The density of the matrix, represented by the symbol D, is therefore simply given by the formula $$D = \left(\frac{1}{2d_2}\right)^2,$$

or $D = n^2$. Therefore, according to the present invention, merely two squares, i.e., the orientation squares 105, 110, are necessary to convey required information about the location, orientation, size, and density of the matrix 100 according to the present invention. This feature allows the matrix 100 to consume significantly less space than conventional binary code matrices, some of which utilize all of the squares along the matrix perimeter to convey the required information, thereby increasing the space necessary for use of the conventional matrix. On the other hand, the matrix 100, unlike some conventional matrices, utilizes available space more efficiently and, as a result, may be printed in very small areas where space is of primary consideration.

As may be seen by referring to the formulas described above, the size of the matrix 100 is determined by not only the number of squares included within the matrix 100, but also by the square size, which, according to the present invention, is variable. As a result, the size of the matrix 100 may be conveniently decreased, without eliminating any of the information contained in the matrix 100, by simply decreasing the size of the squares. Thus, the size of the matrix 100 may be advantageously varied according to the available space in which it is to be printed.

In addition to the orientation squares 105, 110, the matrix 100 further includes coded information, as described above, and parity information by which the coded information may be verified. The coded information, in accordance with the preferred embodiment of the present invention, is in the form of a six bit binary code, wherein each bit is represented by a single black or white square. Preferably, 0's are represented as white squares and 1's are represented as black squares. If the matrix 100 is oriented such that the first orientation square 105 is located in the lower left corner, as shown, the squares representing the coded information begin at the lowest row 125 of the matrix 100 and are read left to right. The orientation squares 105, 110 and the parity information are not included in the coded information, as may be better understood by referring to FIG. 2.

FIG. 2 is an illustration depicting the types of squares located within the matrix 100. As described above, the orientation squares 105, 110 are located in the lower left and upper right corners of the matrix 100. Additionally, the parity information is formed by black and white squares located along two sides of the matrix 100. More specifically, black and white squares located in the topmost row of the matrix 100, excepting the second orientation square 110, form a parity row 205. In like manner, black and white squares located in the far right column of the matrix 100, again excepting the second orientation square 110, form a parity column 210. The black and white squares forming the coded information fill the remainder of the matrix 100.

In accordance with the preferred embodiment of the present invention, the color of each parity square in the parity row 205 is determined by the number of black squares in a corresponding column of black and white squares. Similarly, the color of each parity square in the parity column 210 is determined by the number of black squares in a corresponding row of black and white squares. A black parity square preferably indicates that the row or column corresponding thereto includes an even number of black squares. Conversely, a white parity square indicates that the row or column corresponding thereto includes an odd number of black squares. In this manner, optical scanning equipment employed to decode the coded information may simply compare the color of a parity square with the number of black squares in the corresponding column or row to determine if possible errors are present in the coded information. The errors may thereafter be corrected, in a manner described below, without reference to redundant coded information, as in the case of some conventional binary code matrices.

With reference to FIG. 3, a chart contains the binary, decimal, and character representations of the coded information formed by the black and white squares. As described above, each black square included in the coded information preferably represents a 1, while each white square represents a 0. In accordance with the preferred embodiment of the present invention, a six bit binary code is used, i.e., each character is represented by six bits. This code is sufficient to represent the numbers zero through nine, the alphabet, and numerous punctuation marks. In alternate embodiments of the present invention, depending upon the characters included in the code, a greater or a lesser number of bits could represent each character. For example, if only the numbers zero through nine are to be included in the coded information, a four bit binary code is sufficient.

Returning to FIG. 1, the first bit of coded information begins at the black square 220 located to the right of the first orientation square 105 in the lowest row 125 of the matrix 100. By decoding the information from left to right at each row, excluding the orientation squares 105, 110 and the parity information, it can be seen that the first six squares of coded information form the binary number '100001', which is translated into the character 'A'. The second six squares form the binary number '110100', which is translated into the character 'T' and appended to the character 'A' to form the word 'AT'. The remaining three squares 222 of the coded information are insufficient to convey further information and are therefore colored black to indicate that they are "null" characters, i.e., meaningless characters. The translation of the coded information may be verified by reference to the parity squares included in the parity row 215 and the parity column 210, as may be better understood by referring to FIG. 4.

FIG. 4 is an illustration of a matrix 400, which, in accordance with the preferred embodiment of the present invention, includes parity information by which erroneously coded information may be detected and corrected. As described above, the matrix 400 includes a first orientation square 405 located in the lower left corner and a second orientation square 410 located in the upper right corner. The matrix 400 further includes a parity column 415 formed from black and white squares, excluding the second orientation square 410, located along the right side of the matrix 400. Similarly, a parity row 420 is formed from black and white squares, again excluding the second orientation square 410, located along the upper side of the matrix 400.

Initial translation of the coded information, without reference to the parity row 420 or parity column 415, indicates that the coded information includes a first binary number '100001', which represents the character 'A', and a second binary number '010100', which represents the character '4'. However, the parity information, i.e., the parity column 415 and the parity row 420, indicates that the coded information includes an error. This error may be initially detected by noting that the color of the parity square 425 for the second row 430 of the coded information shows that the second row 430 should include an even number of black squares. However, the second row 430 actually includes only one black square. Therefore, at least one square in the second row 430 is incorrectly colored. The error is then pinpointed by referring to the parity row 420 and observing that the parity square 435 for the fourth column 440 of the coded information indicates that the fourth column 440 should include an even number of black squares. In fact, the fourth column 440 includes only one black square. It can be determined, therefore, that the square 445 at which the fourth column 440 and the second row 430 intersect is incorrectly colored and should actually be black. As a result of this determination, the second binary number may be changed from '010100' to '110100', which represents the character 'T'. The coded information then properly reads 'AT'.

In the manner described above, errors in the coded information may not only be detected, but, in most cases, may also be corrected. Furthermore, this error correction may be conveniently performed after reference to parity information formed from only a single row and a single column of black and white squares, i.e., the parity row 420 and the parity column 415. Thus, the parity information included in matrix 400 consumes minimal space within the matrix, resulting in only an insignificant increase in the size of the matrix 400. Conventional binary code matrices, on the other hand, usually include no parity information at all or either repeat the coded information within the matrix. If the coded information is repeated within the matrix, the size of the matrix can be almost doubled, thereby rendering the matrix unsuitable for use in many small areas. Although the exclusion of parity information from a conventional matrix prevents the problems causes by increasing matrix size, additional problems are created when the coded information itself is incorrect or when the coded information is translated incorrectly. It may be appreciated, therefore, that the matrix in accordance with the preferred embodiment of the present invention solves several of the problems presented by conventional matrices.

Referring next to FIG. 5, an illustration depicts an electronic device 500 having a printed circuit (pc) board 505 enclosed by a housing 507. A binary code matrix 510 according to the present invention is printed on the pc board 505. As described above, the binary code matrix 510 includes two orientation squares by which optical scanning equipment can locate and orient the matrix 510. The orientation squares further convey necessary size and density information about the matrix 510. In addition to the orientation squares, the matrix 510 includes coded information and parity information, both of which are formed from black and white squares located within the perimeter of the matrix 510. Although the coded information may consist of any characters included in the binary code, it preferably includes information by which the pc board 505 can be identified by the optical scanning equipment.

Use of the matrix 510, in accordance with the preferred embodiment of the present invention, is especially advantageous in more complex electronic devices in which space is of primary consideration. Because many complex electronic devices, such as paging receivers, are becoming smaller and less bulky, components on pc boards utilized by the electronic devices are becoming more crowded. As a result, less space remains for the placement of identification information, such as the matrix 510, on the pc boards. Therefore, unlike the matrix 510 according to the present invention, many larger conventional binary code matrices are unsuitable for use in smaller, complex electronic devices.

FIG. 6 is an illustration of the optical scanning equipment 600 which may be employed to translate the coded information included within the matrix 510 (FIG. 5) on the pc board 505. Preferably, the optical scanning equipment 600 is utilized in conjunction with additional processing equipment (not shown) in an automated manufacturing process. In accordance with the preferred embodiment of the present invention, the pc board 505 is transported, perhaps by a conveyor belt 605, to a location beneath an optical scanner 610, such as a camera. The optical scanner 605 thereafter relays an image of the matrix 510 to a computing device 615. The computing device 615, in a manner to be described below, determines the correct orientation, size, and density of the matrix 510 and translates the coded information included within the matrix 510. According to the present invention, the computing device 615 further references the parity information, which is in the form of a parity column and a parity row, to verify the translated information and, if errors are present, correct the translated information. As mentioned above, the translated information is preferably utilized to identify the pc board 505, subsequent to which the pc board 505 may be further processed by the additional processing equipment in a manner determined by the translated information.

By way of example, the optical scanning equipment 600 may be utilized in an automated manufacturing process during which electrical and mechanical components are mounted on multiple types of pc boards, each of which has a binary code matrix including information about the pc board type. As each pc board is shuttled by the conveyor belt 605 towards the additional processing equipment, i.e., component placement equipment, the optical scanning equipment 610 records and transmits an image of the matrix to the computing device 615. The computing device 615 then orients the matrix and translates the coded information to determine the pc board type. The translated information may subsequently be utilized to direct the component placement equipment as to which components are to be placed on the pc board. In this manner, multiple types of pc boards may be randomly processed on the same automated line. Furthermore, the described process does not require recognition of the pc board type by a human operator, thereby preventing errors which could arise if different types of pc boards appear similar to the human eye. In addition to the application described in the above example, it may be appreciated by one skilled in the art that many other types of applications may benefit from the present invention.

Figure 7:
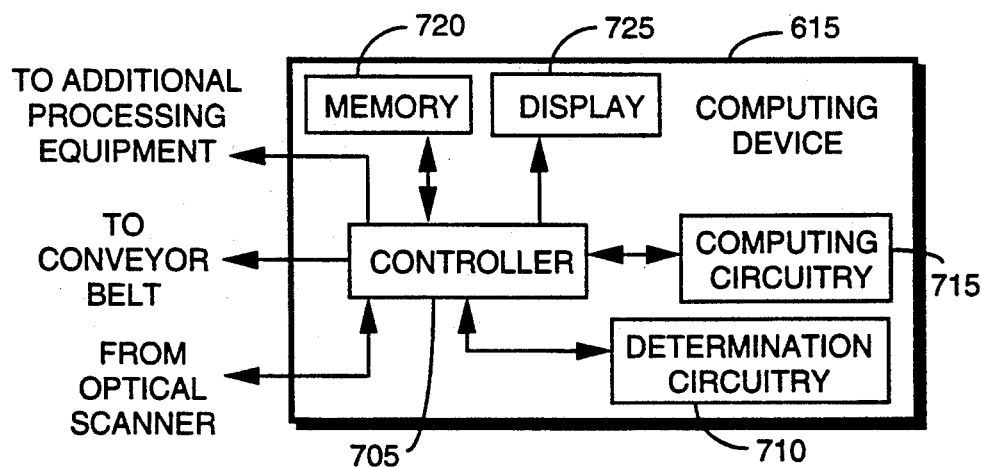
FIG. 7 is a block diagram of the computing device of FIG. 6 in accordance with the preferred embodiment of the present invention.

With reference to FIG. 7, a block diagram of the computing device 615 is shown. In accordance with the preferred embodiment of the present invention, a controller 705 within the computing device 615 receives the image of the matrix 510 (FIG. 5) from the optical scanner 610 (FIG. 6). Determination circuitry 710 coupled to the controller 705 then references the orientation squares included within the matrix 510 to determine the diameter of the circle centered in the first orientation square. The determination circuitry 710 further determines the distance between the center of the circle within the first orientation square and the center of the circle within the second orientation square. Thereafter, the controller 705 provides the determined diameter and distance to computing circuitry 715, which, according to the present invention, utilizes a predetermined set of formulas, such as the ones described above, to compute the size, number, and locations of the black and white squares within the matrix 510. In response to reception of the computed information from the computing circuitry 715, the controller 705 translates the coded information. Additionally, the controller 705 references the parity information to verify and correct, if necessary, the translated information.

In accordance with the preferred embodiment of the present invention, the controller 705, after translation of the coded information, compares the translated information with information stored in a memory 720. Preferably, the stored information includes pc board identification information, such as pc board type, which is associated with the translated information. For example, if the electronic device 500 (FIG. 5) is a paging receiver, the coded information included in the matrix 510 could specify whether the pc board 505 is a receiver board, in which case the coded information might be translated to read 'R', or a decoder board, in which case the coded information might be translated to read 'D'. After translation, the controller 705 could compare the translated information, i.e., 'R' or 'D', with the stored information in the memory 720 to determine which of the two types of pc boards is being processed. Thereafter, the controller 705 may, if desired, generate an information signal directing a display 725 to visibly present the stored information associated with the translated information. In this manner, a human operator is able to access the translated information.

If the pc board 505 is to be processed by additional processing equipment, such as component placement equipment, the controller 705 may further direct the conveyor belt 605 to transport the pc board 505 to another position wherein the additional processing equipment is located. The controller 705 may still further generate and transmit a signal, perhaps containing instructions associated with the type of the pc board 505, to the additional processing equipment, in response to which the additional processing equipment processes the pc board 505 correctly.

In summary, the binary code matrix in accordance with the preferred embodiment of the present invention may be implemented in a considerably smaller area than that required by most conventional binary code matrices. Unlike typical matrices, the matrix according to the present invention utilizes only two squares, referred to as orientation squares, to convey information, such as matrix size and density, necessary for decoding of the matrix. In a typical matrix, on the other hand, at least two sides of the matrix, and sometimes regions surrounding the entire matrix, are utilized to convey the necessary information. Furthermore, in typical matrices, the primary method for error correction is the placement of redundant information in a location within the matrix, thereby almost doubling the size of the matrix. The binary code matrix according to the present invention, however, contains error correction information, i.e., parity information, in a single row and a single column of the matrix. It can be seen, therefore, that the binary code matrix according to the present invention may occupy significantly less space than conventional matrices without decreasing the amount of included information. As a result, the matrix, unlike conventional matrices, may be suitable for use in smaller consumer articles, such as complex electronic devices, that have little space for the placement of coded information.

It may be appreciated by now that there has been provided an optically readable binary code matrix that maximizes space usage. The binary code matrix further utilizes a minimal number of squares to distinguish the binary code matrix from the surrounding area. Additionally, the binary code matrix includes data by which errors in decoded information may be detected and corrected.

What is claimed is:

1. An optically readable matrix having four intersecting sides of approximately equal length defining a perimeter, the matrix including a binary code formed from light and dark areas of substantially equal sizes located within the perimeter, the matrix comprising:

a first light area, two sides of which are bounded by first and second sides of the four intersecting sides, the first light area containing a first geometrically shaped area, wherein the first geometrically shaped area is dark, and wherein the first geometrically shaped area is located in predetermined position within the first light area and has a predetermined size relationship with the first light area; and a first dark area, two sides of which are bounded by third and fourth sides of the four intersecting sides, the first dark area containing a second geometrically shaped area, wherein the second geometrically shaped area is light, and wherein the second geometrically shaped area is located in a predetermined position within the first dark area and has a predetermined size relationship with the first dark area.

2. The matrix in accordance with claim 1, wherein a column of light and dark areas bounded by the third side of the four intersecting sides is a parity column, wherein each of the light areas included in the parity column implies that a row of light and dark areas corresponding thereto and forming the binary code includes an odd number of dark areas, and wherein each of the dark areas included in the parity column implies that a row of light and dark areas corresponding thereto and forming the binary code includes an even number of dark areas.

3. The matrix in accordance with claim 1, wherein a row of light and dark areas bounded by the fourth side of the four intersecting sides is a parity row, wherein each of the light areas included in the parity row implies that a column of light and dark areas corresponding thereto and forming the binary code includes an odd number of dark areas, and wherein each of the dark areas included in the parity row implies that a column of light and dark areas corresponding thereto and forming the binary code includes an even number of dark areas.

4. The matrix in accordance with claim 1, wherein the first geometrically shaped area is a first circular area located approximately in the center of the first light area.

5. The matrix in accordance with claim 4, wherein the diameter of the first circular area is approximately equal to half of the length of the first light area.

6. The matrix in accordance with claim 5, wherein the second geometrically shaped area is a second circular area located approximately in the center of the first dark area.

7. The matrix in accordance with claim 6, wherein the diameter of the second circular area is approximately equal to half of the length of the first dark area.

8. The matrix in accordance with claim 7, wherein the length of each of the four intersecting sides is determined by the distance between the center of the first circular area and the center of the second circular area.

9. The matrix in accordance with claim 8, wherein the length of each of the four intersecting sides is given by a first formula $$l = \frac{d_1}{\sqrt{2}} + 2d_2,$$

wherein l represents the length of each of the four intersecting sides, $d_1$ represents the distance between the center of the first circular area and the center of the second circular area, and $d_2$ represents the diameter of the first circular area.

10. The matrix in accordance with claim 9, wherein the size of each of the light and dark areas forming the binary code is determined by the diameter of the first circular area.

11. The matrix in accordance with claim 10, wherein each of the light and dark areas forming the binary code are substantially square in shape and the length and width of each of the light and dark areas is twice the diameter of the first circular area.

12. The matrix in accordance with claim 11, wherein the density of the matrix is defined to be a total number of light and dark squares included in the matrix, and wherein the density is given by a second formula $$D = \left(\frac{l}{2d_2}\right)^2,$$

wherein D represents the density of the matrix, l represents the length of each of the four intersecting sides as given by the first formula, and $d_2$ represents the diameter of the first circular area.

13. An electronic device, comprising:

at least one printed circuit board;

a housing for enclosing the at least one printed circuit board; and an optically readable matrix imprinted upon the at least one printed circuit board, the matrix having four intersecting sides of approximately equal length defining a perimeter, the matrix including a binary code formed from light and dark areas of substantially equal sizes located within the perimeter, the matrix comprising:

a first light area, two sides of which are bounded by first and second sides of the four intersecting sides, the first light area containing a first geometrically shaped area, wherein the first geometrically shaped area is dark, and wherein the first geometrically shaped area is located in a predetermined position within the first light area and has a predetermined size relationship with the first light area; and a first dark area, two sides of which are bounded by third and fourth sides of the four intersecting sides, the first dark area containing a second geometrically shaped area, wherein the second geometrically shaped area is light, and wherein the second geometrically shaped area is located in a predetermined position within the first dark area and has a predetermined size relationship with the first dark area.

14. An apparatus for optically reading a matrix imprinted on a device, the matrix having four intersecting sides of approximately equal length defining a perimeter, the matrix including a binary code formed from light and dark areas of substantially equal sizes located within the perimeter, the apparatus comprising:

scanning means for optically scanning the matrix and for locating a first geometrically shaped area and a second geometrically shaped area, wherein the first geometrically shaped area is located in a predetermined location within a first of the light and dark areas and has a predetermined size relationship with the first of the light and dark areas, and wherein the second geometrically shaped area is located in a predetermined position within a second of the light and dark areas and has a predetermined size relationship with the second of the light and dark areas;

determining means coupled to the scanning means for determining the size of the first geometrically shaped area and a distance between the center of the first geometrically shaped area and the center of the second geometrically shaped area, wherein the determining means further generates an information signal based upon the determinations;

computing means coupled to the determining means for computing, in response to reception of the information signal generated by the determining means, the size of each of the light and dark areas, the number of the light and dark areas forming the matrix, a beginning location of the light and dark areas forming the binary code, and an end location of the light and dark areas forming the binary code; and control means coupled to the scanning means, the determining means, and the computing means for controlling the operation thereof, and for decoding information included in the binary code formed by the light and dark areas.

15. The apparatus in accordance with claim 14, wherein the apparatus further comprises:

a memory coupled to the control means for storing values, wherein the control means further compares the decoded information with the stored values to recover identification information associated with the device on which the matrix is imprinted.

16. The apparatus in accordance with claim 15, wherein:

the control means generates an identification signal in response to recovery of the identification information associated with the device, the identification signal including at least the identification information associated with the device; and the apparatus further comprises display means coupled to the control means for displaying the identification information associated with the device in response to reception of the identification signal.

17. A method for determining the size and the density of an optically readable matrix having four intersecting sides of approximately equal length defining a perimeter, the matrix including a binary code formed from light and dark areas of substantially equal sizes located within the perimeter, wherein each of the light and dark areas are substantially square shaped and have approximately equal lengths and widths, the method comprising the steps of:

(a) optically scanning the matrix to locate a first geometrically shaped area and a second geometrically shaped area, wherein the first geometrically shaped area is located in a predetermined location within a first of the light and dark areas and has a predetermined size relationship with the first of the light and dark areas, and wherein the second geometrically shaped area is located in a predetermined position within a second of the light and dark areas and has a predetermined size relationship with the second of the light and dark areas;

(b) determining the size of the first geometrically shaped area;

(c) determining the distance between the center of the first geometrically shaped area and the center of the second geometrically shaped area;

(d) calculating the size of each of the light and dark areas in response to step (b);

(e) calculating the length of each of the four intersecting sides in response to steps (b) and (c); and (f) determining the number of the light and dark areas in response to steps (d) and (e).

* * * * *